Sept. 24, 1963

E. ADLER 3,105,160

CIRCUIT PROVIDING A SECOND PARALLEL PATH FOR FAST CAPACITOR RECHARGE

Filed Aug. 29, 1961

*INVENTOR.*

ERNST ADLER

*BY* Herbert W. Arnold

*ATTORNEYS.*

United States Patent Office 3,105,160

Patented Sept. 24, 1963

3,105,160
CIRCUIT PROVIDING A SECOND PARALLEL PATH FOR FAST CAPACITOR RECHARGE

Ernst Adler, Watertown, Mass., assignor to Raytheon Company, Lexington, Mass., a corporation of Delaware Filed Aug. 29, 1961, Ser. No. 134,675
11 Claims. (Cl. 307—88.5)

The present invention relates to an electronic switching device, and, more particularly, to an electronic switching device utilizing a semi-conductive device adapted to operate in the avalance mode.

The use of semi-conductive devices such as transistors adapted to operate in the avalanche mode as electronic switches is known in the prior art. By reason of the particular current characteristics of the avalanche transistors, as described, for example, in the U.S. Patent 2,843,515 to Statz et al., assigned to the assignee of the present application, such avalanche transistors may be used to great advantage in electronic switches because of the very high speed with which they are able to switch from one state to another. However, the known switching devices utilizing such semi-conductive devices also entail certain limitations by reason of the relatively long time required to revert to the original state for a subsequent operation. Ordinarily, this delay in the prior art devices is caused by the necessity of recharging a capacitor connected to the collector, which experiences a voltage drop during the switching operation, through a circuit having a relatively high ohmic resistance value.

The present invention aims at effectively eliminating these shortcomings of the prior art switching devices utilizing semi-conductive devices operating in the avalanche mode by the use of a second semi-conductive device operating in the avalanche mode which effectively decreases the resistance of the charging circuit for the capacitor.

It is, therefore, the primary object of this invention to provide a switching device utilizing avalanche semi-conductive devices which revert to the original state, for subsequent operation thereof, in a relatively short period of time.

A further object of the present invention resides in the provision of an avalanche transistor switching circuit which is simple, utilizes basically conventional circuitry with relatively few parts and provides reliable operation at relatively high speeds.

Another object of the present invention resides in the provision of an electronic switching device in which both the rise time and fall time are of extremely short duration to permit use of the switching device for extremely high speed applications.

Still further object of the present invention resides in a transistorized switching device which may be of relatively compact construction and does not require special trigger pulses to operate the same.

Figure 1:
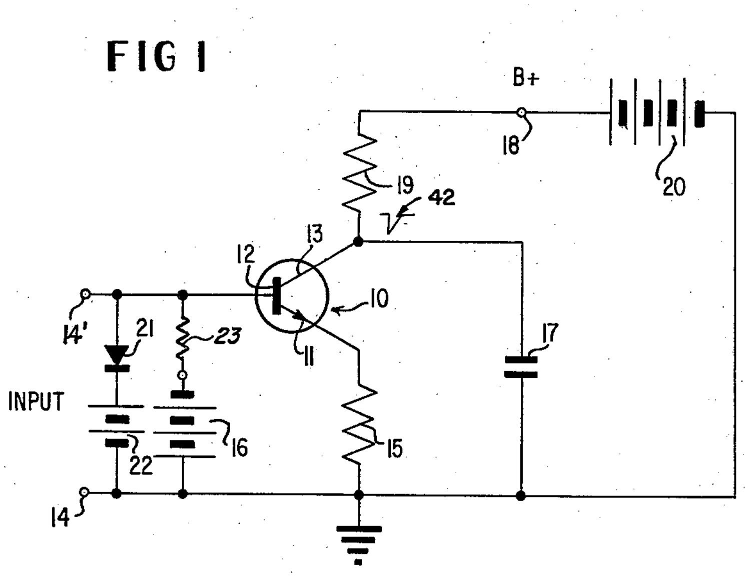
Figure 2:
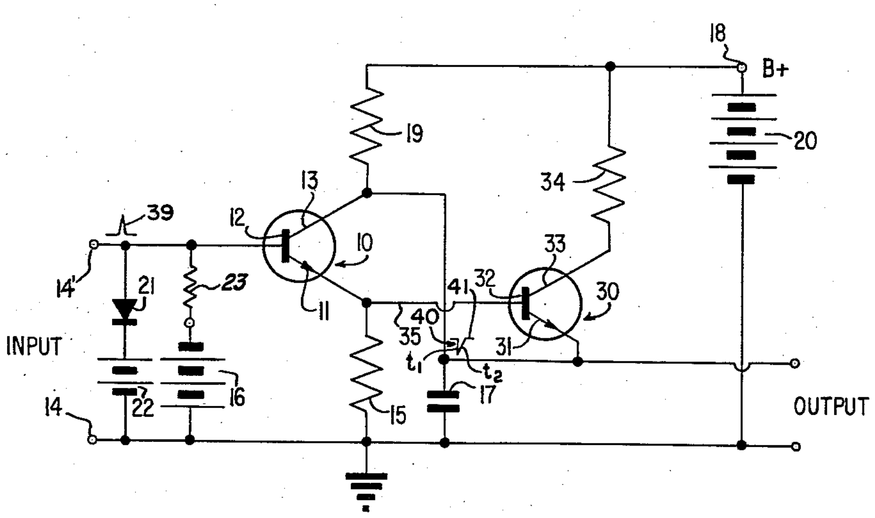

The invention will be better understood as the following description proceeds taken in conjunction with the accompanying drawing, wherein:

FIGURE 1 is a schematic diagram of an avalanche switching device of conventional prior art construction, and FIGURE 2 is a schematic diagram of a transistorized switching device utilizing two avalanche transistors in accordance with the present invention.

Referring now to the drawing wherein like reference numerals are used throughout the two views to designate corresponding parts, and more particularly to FIGURE 1, reference numeral 10 generally designates therein a semi-conductive device operative in the avalanche mode. The semi-conductive device 10 may be a transistor of any suitable known construction and includes an emitter 11, a base 12 and a collector 13. The input for the trigger device is constituted by terminals 14' and 14 to which the trigger pulses are applied. Terminal 14' is thereby connected with the base 12 and the terminal 14 to ground, while emitter 11 is connected to ground through a resistor 15. A bias voltage 16 is applied between ground and the base 12 through load resistor 23. A clamping circuit consisting of diode 21 and clamping voltage 22 may also be connected to the base 12, as shown in FIG. 1.

A capacitor 17 of suitable value is connected between the collector 13 and ground while the positive terminal of the B+ power supply 20 which is connected between terminal 18 and ground is applied to the collector 13 through a resistor 19 of suitable value. Resistor 15 normally has a relatively small ohmic value in comparison to the ohmic value of resistor 19.

FIGURE 1 is an avalanche transistor switch of conventional construction which is used as basic switching circuit in computers, pulse generators, chopper amplifiers, etc.

In operation, the transistor 10 is normally biased by the bias voltage 16 so as to be non-conductive. In the non-conductive state of the transistor 10 the capacitor 17 finds itself charged to the B+ voltage of the power supply 20 through the circuit including resistor 19. The charging time, as is well known, is a function of the RC time constant of the charging circuit including resistor 19. If now a positive pulse is applied to terminal 14', the transistor 10 will become conductive and the capacitor 17 is discharged through the transistor 10 and the resistor 15. Since resistor 15 is normally of relatively small ohmic value, such discharge can take place very rapidly. As soon, however, as the transistor 10 becomes again non-conductive, that is as soon as the trigger pulse subsides at collector 13, the capacitor 17 seeks to recharge through the charging circuit including resistor 19. Since resistor 19 is usually of relatively high ohmic value, the RC time constant of this circuit is such as to require a relatively long period of time for the transistorized switching device of FIGURE 1 to revert to the original state for subsequent operation. In other words, since capacitor 17, which has one of its plates directly connected to the collector 13, experiences a voltage drop during switching operation when the transistor 10 becomes conductive, the capacitor 17 must recharge through a charging circuit including resistor 19 having a relatively high ohmic value when the transistor 10 becomes again non-conductive, thereby delaying the return of the switch to its original state for subsequent operation.

In FIGURE 2, in which parts corresponding to those of FIGURE 1 are designated by similar reference numerals, reference numeral 10 again designates a semi-conductive device such as a transistor operative in the avalanche mode which includes an emitter 11, a base 12 and a collector 13. The input circuit is again constituted by terminals 14' and 14 and the emitter 11 is again connected to round through a resistor 15 while the terminal 14' is connected to the base 12. A bias voltage 16 of suitable value is again applied between the base 12 and ground through load resistor 23. A capacitor 17 is again connected between the collector 13 and ground. The positive terminal of the B+ voltage supply 20 is again connected to terminal 18 which, in turn, is connected to the collector 13 through resistor 19.

According to this invention, a second semi-conductive device such as a transistor operative in the avalanche mode and which is generally designated by reference numeral 30, has its emitter 31 connected to the collector 13, its base 32 connected to emitter 11 of the transistor 10, and its collector 33 connected to the B+ terminal 18 of the power supply 20 through a resistor 34.

The transistor 30, during operation, is normally maintained in the non-conductive state by reason of the large positive bias effectively applied to its emitter junction by battery 20 when the base 32 thereof is at the potential of emitter 11 which itself, with transistor 10 in the non-conducting state, is at ground potential and also the emitter 31 thereof is substantially at B+ voltage, which is the voltage existing at the collector 13 when transistor 10 is non-conductive and drawing substantially no current through resistors 15 and 19. When the transistor 10 is rendered conductive by the application of a trigger pulse 39 between terminals 14' and 14, a negative pulse, as shown by waveform 40 at time $t_1$ is also applied simultaneously to the emitter junction of transistor 30 since the potential of the base 32 thereof is raised to the potential of the emitter 11 which is now at a voltage equal to the IR-drop across resistor 15 whereas the voltage of emitter 31 thereof is reduced by the IR-drop of resistor 19 to the same extent that the voltage on collector 13 decreases. Application of this negative pulse to the emitter junction of transistor 30 with respect to its base 32 switches the transistor 30 to the conductive state thereof in which conduction takes place from its collector 33 to the emitter 31. As a result thereof, the resistor 34 is effectively connected in parallel with the resistor 19 as long as the transistor 30 remains conducting. The voltage at emitter 30 then becomes at time $t_2$ a positive-going pulse as shown by the rising portion 41 of waveform 40.

If the transistor 10 now reverts to its original non-conducting state, the capacitor 17 has to be recharged. Whereas in the prior art construction of FIGURE 1, such recharge must take place exclusively through the resistor 19 at a relatively slow rate shown by waveform 42, there is provided according to this invention a second parallel charging path including transistor 30 and resistor 34 so that the effective ohmic value of the charging circuit and therewith the RC time constant may be decreased to thereby increase the speed with which capacitor 17 is recharged, as shown by waveform 41. As the recharge progresses, the transistor 30 will also eventually revert to its original non-conducting state.

The following are typical values for a circuit in accordance with the present invention, it being understood that these values may be varied in conformity with well-known design practices and are given herein only for illustrative purposes:

Resistor 15=47 ohms
Resistor 19=47,000 ohms
Resistor 23=10,000 ohms
Resistor 34=47,000 ohms
Capacitor 17=.001 $\mu$f.
Voltage 16=−10 volts
Voltage 20=120 volts
Clamping voltage 22=−3 volts Transistors 10 and 30 may be commercially available types 2N1468 transistors, operating in the avalanche mode.

Diode 21 may be a commercially available type 1N645 diode.

In actual tests, the fall-time of the trailing edge of the pulses produces with the circuit of FIG. 1 amounted to about 70 ns. (nanoseconds) with capacitor 17 connected into the circuit as therein and to about 3 ns. with a similar circuit without capacitor 17. With a circuit according to the present invention as illustrated in FIG. 2 and including the capacitor 17, the fall-time of the trailing edge of the pulses produced thereby amounted to about 20 ns. whereas without capacitor 17 this fall-time amounted to about 1 ns. Thus, it can be readily seen that a reduction in the fall-time by better than one-third is obtainable by the use of a circuit in accordance with the present invention. Moreover, the added transistor 30 does not affect, i.e., does not add to the leading edge time of the pulse.

It can be seen, therefore, that there has been provided by the present invention an avalanche transistor switching device in which the time required for reverting to the original state for subsequent operation is relatively short. Consequently, the avalanche transistor switching device of the present invention may be used for higher speed applications than the prior art construction. Additionally, no special limitations are placed on the properties of the trigger pulse for operating transistor 10 as a relatively small pulse would be quite satisfactory for the operation of the switching device of the present invention. Moreover, since the two transistors 10 and 30 have electrodes connected together they can be manufactured as one unit on a common mechanical and electrical base, thereby reducing the spatial requirements and permitting design adaptations to very high frequencies. Although there has been described what is considered to be a preferred embodiment of the present invention, various adaptations and modifications thereof may be made without departing from the spirit and scope of the appended claims. For example, the output may be taken in any other way, for instance, from the emitter or by any other known means.

I claim:

1. A switching device utilizing semi-conductive devices operative in the avalanche mode and having a conductive and a non-conductive state, comprising a first semi-conductive device operative in the avalanche mode including an emitter, a base means and a collector, a first circuit for the current flow of said first semi-conducting device operatively connected between said collector and said emitter and including, in series, a resistor and a voltage source, means for normally maintaining said first semi-conductive device in one of said two states, input means operative upon application of a predetermined signal to switch said first semi-conductive means from said one to the other state, capacitor means operatively connected in parallel with said first semi-conductive device and having a first charging circuit including said resistor, and means including a second semi-conductive device effectively forming a second charging circuit in parallel with said first charging circuit for charging said capacitor means, and means operatively connecting said second semi-conductive device with said first semi-conductive device to switch said second semi-conductive device from one of said two states to the other upon switching of said first semi-conductive device.

2. An electronic switching device utilizing semi-conductive devices operative in the avalanche mode, comprising a first semi-conductive device operative in the avalanche mode including an emitter, a base and a collector, a first circuit for the current flow of said first semi-conducting device operatively connected between said collector and said emitter and including, in series, a resistor connected to said collector and a voltage source, biasing voltage means applied intermediate said base and said emitter to maintain said first semi-conductive device normally inoperative, input means for applying triggering pulses to said base to selectively render said first semi-conductive means operative, a capacitor operatively connected between said collector and said emitter adapted to be charged through a circuit including said resistor, and means effectively placing a second charging circuit in parallel with said first-mentioned charging circuit to reduce the time required for recharging said capacitor upon reversion of said first semi-conductive device to its inoperative state, said last-mentioned means including a second semi-conductive device operative in the avalanche mode.

3. An electronic switching device utilizing semi-conductive devices operative in the avalanche mode, comprising a first semi-conductive device operative in the avalanche mode including an emitter, a base and a collector, a first circuit for the current flow of said first semi-conducting device operatively connected between said collector and said emitter and including, in series, a first resistor connected to said collector and a voltage source, biasing voltage means applied intermediate said base and said emitter to maintain said first semi-conductive device normally inoperative, input means for applying triggering pulses to said base to selectively render said first semi-conductive means operative, a capacitor operatively connected between said collector and said emitter adapted to be charged through a circuit including said first resistor, and means effectively placing a second charging circuit in parallel with said first-mentioned charging circuit to reduce the time required for recharging said capacitor upon reversion of said first semi-conductive device to its inoperative state, said last-mentioned means including a second semiconductive device operative in the avalanche mode having a collector connected to said voltage source through a second resistor, a base operatively connected to the emitter of said first semi-conductive device and an emitter operatively connected with the collector of said first semi-conductive device.

4. A switching device utilizing semi-conductive devices operative in the avalanche mode and having a conductive and a non-conductive state, comprising a first semi-conductive device operative in the avalanche mode including an emitter, a base means and a collector, a first circuit for the current flow of said first semi-conducting device operatively connected between said collector and said emitter and including, in series, a resistor and a voltage source, means for normally maintaining said first semi-conductive device in one of said two states, input means operative upon application of a predetermined signal to switch said first semi-conductive means from said one to the other state, capacitor means operatively connected in parallel with said first semi-conductive device and having a first charging circuit including said resistor, and means including a second semi-conductive device effectively forming a second charging circuit in parallel with said first charging circuit for charging said capacitor means.

5. A switching device utilizing semi-conductive devices operative in the avalanche mode, comprising a first semi-conductive device operative in the avalanche mode including an emitter, a base and a collector, a first circuit having a relatively high ohmic value for the current flow of said first semi-conducting device operatively connected between said collector and said emitter and including a voltage source, biasing voltage means applied intermediate said base and said emitter to maintain said first semi-conductive device normally substantially non-conductive, input means for applying triggering pulses to said base to render said first semi-conductive means conductive in the avalanche mode upon application of a switching pulse, a capacitor operatively connected between said collector and said emitter, said first-mentioned circuit forming a charging circuit for said capacitor of relatively high ohmic value, and means effectively placing a second charging circuit effectively in parallel with the first charging circuit to reduce the time required for recharging said capacitor upon reversion of said first semi-conductive device to its non-conductive state including a second semi-conductive device operative in the avalanche mode.

6. A switching device utilizing semi-conductive devices operative in the avalanche mode, comprising a first semi-conductive device operative in the avalanche mode including an emitter, a base and a collector, a first circuit having a relatively high ohmic value for the current flow of said first semi-conducting device operatively connected between said collector and said emitter and including a voltage source, biasing voltage means applied intermediate said base and said emitter to maintain said first semi-conductive device normally substantially non-conductive, input means for applying triggering pulses to said base to render said first semi-conductive means conductive in the avalanche mode upon application of a switching pulse, a capacitor operatively connected between said collector and said emitter, said first-mentioned circuit forming a charging circuit for said capacitor of relatively high ohmic value, and means effectively placing a second charging circuit effectively in parallel with the first charging circuit to reduce the time required for recharging said capacitor upon reversion of said first semi-conductive device to its non-conductive state including a second semi-conductive device operative in the avalanche mode, said second semi-conductive device having a collector connected to said voltage source, a base operatively connected to the emitter of said first semi-conductive device and an emitter operatively connected with the collector of said first semi-conductive device.

7. An electronic switching device utilizing semi-conductive devices operative in the avalanche mode and having a conductive state and a non-conductive state, comprising a first semi-conductive device operative in the avalanche mode and a first circuit of relatively high ohmic value connected thereto for the current flow of said first semi-conducting device, means for normally maintaining said first semi-conductive device in one of the two states thereof and adapted to be switched to the other state thereof, charging capacitor means operatively connected in said first circuit and adapted to follow changes of voltages appearing across said first semi-conductive device through said first circuit of relatively high ohmic value, and means effectively forming a second charging circuit of relatively lower ohmic value to reduce the time required for charging said capacitor means upon reversion of said first semi-conductive device to said one of its two states, said last-mentioned means including a second semi-conductive device operative in the avalanche mode.

8. A switching device utilizing semi-conductive devices operative in the avalanche mode and having conductive and substantially non-conductive states, comprising a first semi-conductive device operative in the avalanche mode and a first circuit of relatively high ohmic value connected to said first semi-conductive device for the current flow through said first semi-conducting device, means for normally maintaining said first semi-conductive device in one of said two states and operative to be switched to the other state thereof by the application of a control signal, charging capacitor means operatively connected effectively across said first semi-conductive device, and means including a second semi-conductive device for reducing the time required for charging said capacitor means upon reversion of said first semi-conductive device to said one state.

9. An electronic switching device utilizing semi-conductive devices operative in the avalanche mode and having a conductive state and a non-conductive state, comprising a first semi-conductive device operative in the avalanche mode and a first circuit of relatively high ohmic value connected thereto for the current flow of said first semi-conducting device, means for normally maintaining said first semi-conductive device in one of the two states thereof and adapted to be switched to the other state thereof, charging capacitor means operatively connected in said first circuit and adapted to follow changes of voltages appearing across said first semi-conductive device through said first circuit of relatively high ohmic value, and means effectively forming a second charging circuit of relatively lower ohmic value to reduce the time required for charging said capacitor means upon reversion of said first semi-conductive device to said one of its two states, said last-mentioned means including a second semi-conductive device operative in the avalanche mode, and means substantially synchronously switching said second semi-conductive device from one to the other state by the switching operation of said first semi-conductive device.

10. An electronic switching device utilizing semi-conductive devices operative in the avalanche mode, comprising a first semi-conductive device operative in the avalanche mode including an emitter, a base and a collector, a first circuit for the current flow of said first semi-conducting device operatively connected between said collector and said emitter and including, in series, a first resistor of relatively high ohmic value connected to said collector, a voltage source and a second resistor of low ohmic value connected to said emitter, biasing voltage means applied intermediate said base and said emitter to maintain said first semi-conductive device normally substantially inoperative, input means for applying a switching signal to said base to render said first semi-conductive means operative, a charging capacitor operatively connected between said collector and said emitter, and means effectively placing a second charging circuit in parallel with the charging circuit for said capacitor constituted by said first resistor to reduce the time required for recharging said capacitor upon reversion of said first semi-conductive device to its inoperation state, said last-mentioned means including a second semi-conductive device operative in the avalanche mode and having a collector connected to said voltage power supply through a third resistor of ohmic value smaller than said first resistor, a base operatively connected to the emitter of said first semi-conductive device and an emitter operatively connected with the collector of said first semi-conductive device.

11. A switching device utilizing semi-conductive devices operative in the avalanche mode and having a conductive and a non-conductive state, comprising a first semi-conductive device operative in the avalanche mode including an emitter, a base and a collector, a first circuit for the current flow of said first semi-conducting device operatively connected between said collector and said emitter and including, in series, a resistor and a voltage source, means for normally maintaining said first semi-conductive device in one of said two states, input means operative upon application of a predetermined signal to switch said first semi-conductive means from said one to the other state, capacitor means operatively connected with said first conductive device and provided with a first charging circuit including said resistor, and means including a second semi-conductive device effectively forming a second charging circuit in parallel with said first charging circuit for charging said capacitor means, said two semi-conductive devices being combined into a common mechanical unit with some of the electrodes thereof directly connected.

No references cited.